(12) United States Patent
Kosonocky (10) Patent No.: US 10,197,455 B2
(45) Date of Patent: Feb. 5, 2019

(54) THERMAL OSCILLATOR

(71) Applicant: Advanced Micro Devices, Inc., Sunnyvale, CA (US)

(72) Inventor: Stephen V. Kosonocky, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 625 days.

(21) Appl. No.: 14/716,064

(22) Filed: May 19, 2015

(65) Prior Publication Data

US 2016/0341604 A1 Nov. 24, 2016

(51) Int. Cl.
| | |
|---|---|
| *G01K 7/01* | (2006.01) |
| *G01K 7/16* | (2006.01) |
| *G01K 13/00* | (2006.01) |
| *H03K 3/0231* | (2006.01) |
| *G01K 7/32* | (2006.01) |

(52) U.S. Cl.
CPC .............. *G01K 7/16* (2013.01); *G01K 7/01* (2013.01); *G01K 7/32* (2013.01); *G01K 13/00* (2013.01); *H03K 3/0231* (2013.01)

(58) Field of Classification Search
CPC ............ G01K 7/02; G01K 3/005; G01K 3/10; G01K 7/42; G01K 7/22; G01K 2013/024; G01K 7/16; G01K 7/01; G01K 7/10; G01K 11/32; G01K 13/00; B23K 31/02; H02M 1/32; H02M 1/38; H02M 1/53806; H01C 7/008; H01C 17/00; H01R 4/023; H01R 4/029; H01R 43/28; G01R 31/048; G01R 31/40; G01J 5/004; G01J 5/00; G01J 5/003; G01J 5/043; G01J 5/0821

See application file for complete search history.

(56) References Cited

U.S. PATENT DOCUMENTS

| | | | | |
|---|---|---|---|---|
| 4,321,561 A | * | 3/1982 | Payne .................... | H03K 3/354 331/108 D |
| 6,300,843 B1 | * | 10/2001 | Kodama ................ | H03K 3/011 331/111 |
| 2006/0114073 A1 | * | 6/2006 | Yarborough, Jr. ..... | H03K 3/011 331/176 |
| 2009/0212875 A1 | * | 8/2009 | Makinwa ............... | H03B 17/00 331/34 |
| 2009/0289174 A1 | * | 11/2009 | Koyama ............... | G01J 1/4204 250/214 DC |

* cited by examiner

*Primary Examiner* — Manish S Shah
(74) *Attorney, Agent, or Firm* — Zagorin Cave LLP (57) ABSTRACT

A temperature dependent oscillator charges a capacitance from a voltage source through a switch. The switch is opened and the capacitance discharges through a transistor having a temperature dependent resistance. The voltage across the capacitance is compared to a predetermined threshold voltage. The comparator asserts a compare signal when the capacitance discharges to a predetermined voltage level. The switch is then closed for a long enough time to recharge the capacitor and then the switch is opened to allow the capacitance to discharge through the transistor. The charging and discharging repeats with a frequency that is exponentially related to temperature. A counter counts the oscillations over a predetermined time period. The count value is processed using a natural log function resulting in a thermal value corresponding to temperature. The thermal value may be corrected for supply voltage errors.

20 Claims, 7 Drawing Sheets

| | | | 0.6V | 0.9V | 1.2V |
|---|---|---|---|---|---|
| | | 20°C | 5.903 | 5.858 | 6.006 |
| | | 40°C | 6.817 | 6.737 | 6.820 |
| | | 100°C | 9.026 | 8.922 | 8.914 |
| Coef0 | $x^2$ | | 1.69E+00 | 1.54E+00 | 1.40E+00 |
| Coef1 | $x$ | | 3.77E-01 | 3.41E+00 | 6.56E+00 |
| Coef2 | 1 | | -4.11E+01 | -5.27E+01 | -7.01E+01 |

THERMAL OSCILLATOR

BACKGROUND

Field of the Invention

Embodiments described herein relate to thermal sensing and more particularly to use of a thermal oscillator in thermal sensing.

Description of the Related Art

Diodes have been used as thermal sensors in integrated circuits. The diode has a relatively linear temperature response and a relatively high temperature coefficient. Diode based thermal sensors may be used to detect temperatures in integrated circuits and prevent over temperature conditions. However, because of their relatively large size, the number of diode based thermal sensors may be limited in certain applications.

SUMMARY OF EMBODIMENTS OF THE INVENTION

Accordingly, in one embodiment, a method includes charging a capacitance from a voltage source through a switch. The capacitance is discharged through a transistor having a temperature dependent resistance. The capacitance voltage is compared to a predetermined threshold voltage and a compare signal is asserted responsive to the capacitance voltage being reduced to the predetermined threshold voltage through discharge of the capacitance through the transistor. The switch is closed to recharge the capacitance responsive to the asserted compare signal and then the switch is opened to allow the capacitance to discharge through the transistor. The charging and discharging is repeated with a frequency that is related to temperature of the transistor.

In another embodiment, a method includes generating an oscillator signal having a frequency that varies exponentially with temperature. The frequency is measured by counting transitions of the oscillator signal in a counter over a time period and generating a count value. A thermal value corresponding to temperature is determined based on the count value and based on the time period.

In another embodiment an apparatus includes a temperature dependent oscillator. The temperature dependent oscillator includes a transistor having a gate coupled to keep the transistor in an off state. A capacitance is coupled to discharge through the transistor and has a discharge rate based on leakage current through the transistor in the off state. A voltage source is coupled to charge the capacitor through a switch to a first voltage. A comparator compares the capacitance voltage to a predetermined threshold voltage that is lower than the first voltage and asserts a compare signal responsive to the capacitance voltage being at or lower than the predetermined threshold voltage. A control signal based on the compare signal closes the switch to recharge the capacitance to the first voltage and then opens the switch to allow the capacitance to again discharge through the transistor.

In another embodiment an apparatus includes an oscillator to supply an oscillator signal having a frequency that varies with temperature. A counter counts transitions of the oscillator signal over a time period and generate a count value. Processing logic coupled to the counter processes the count value and generates a thermal value corresponding to a temperature associated with the oscillator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A thermal sensor uses a thermal-to-time converter to exploit the exponential dependence of a metal oxide semiconductor (MOS) device leakage current on temperature to control an oscillator. The leakage current of the MOS device, controls an oscillator through a variable RC time constant that is exponentially proportional to temperature. Thus, the frequency of the oscillator varies exponentially with temperature because the off resistance of the MOS device, and thus the leakage current, varies with temperature. In an embodiment, digital logic samples the oscillator frequency with respect to a known clock frequency and the oscillator relative frequency is captured by a digital interface. Software running on a microcontroller may be used to linearize the oscillator frequency data using a natural log math function and may also correct for errors due to different supply voltages for the oscillator as explained further herein.

Embodiments described herein improve on the state-of-the-art by being approximately 150 times smaller in area than current diode implementations for thermal sensors that are known to the inventor. Embodiments of the thermal sensor senses temperature using a standard digital supply, varying from, e.g., 0.5V to 1.3V. The thermal oscillator approach uses a time-to-digital converter technique to provide a digital output. Because of the small size of embodiments of the thermal sensor described herein, many more thermal sensors can be present on integrated circuits such as those with one or more processing units (e.g., central processing units (CPUs) and/or graphics processing units (GPUs)) to provide much finer grain thermal sensing. With finer grain thermal sensing, more accurate hot-spot detection is achieved, reducing thermal margins, resulting in increased CPU and/or GPU performance.

Figure 1:
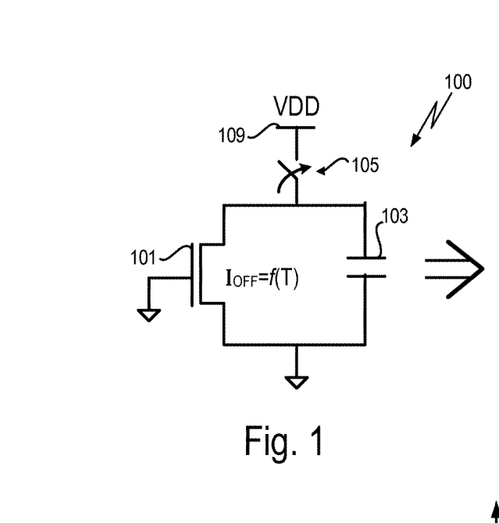
FIG. 1 illustrates a temperature dependent oscillator circuit according to an embodiment.

Referring to FIG. 1, illustrated is an embodiment of a portion of an oscillator 100 having a MOS device (transistor) 101, a capacitor 103, and a switch 105. The transistor 101 is in an off state with the gate voltage tied to ground to ensure the gate voltage is below the threshold voltage of the device. The leakage current through the device ($I_{OFF}$) is a function of temperature (T).

Figure 2:
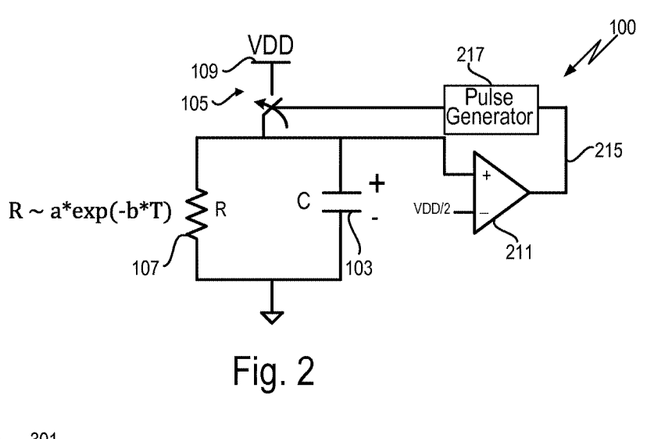
FIG. 2 illustrates additional details of an embodiment of a temperature dependent oscillator circuit.

FIG. 2 shows a high level block diagram showing additional details of an embodiment of oscillator 100 where the resistance of the transistor 101 is shown as resistance 107, where the resistance $R \approx a \times e^{-bT}$, where a and b are empirical constants that vary with technology and manufacturing variations. That is, R is an exponential function of temperature T. In operation, the voltage $V_C$ of capacitor 103 is charged by voltage source 109 to VDD. The switch 105 is then opened and the capacitor discharges through resistor 107 (the off resistance of MOS device 101). The voltage $V_C$ of capacitor 103 discharges where $V_c = V_{init} \times e^{-t/RC}$, where t is time. Comparator 211 compares a threshold voltage (VDD/2 in the illustrated embodiment) to the voltage Vc of capacitor 103 and when the capacitor voltage Vc reaches VDD/2 the comparator 211 sends a control signal 215 to pulse generator 217 to cause switch 105 to close to allow the capacitor 103 to recharge. The pulse generator generates a pulse signal that closes the switch 105 for a sufficient time to charge the capacitor back up to a predetermined level such as VDD and then opens the gate back up to allow the capacitor to discharge through the transistor 101.

Figure 3:
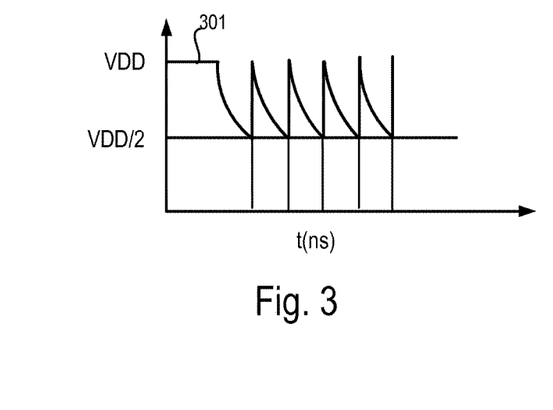
FIG. 3 illustrates an oscillating signal that may be produced by an embodiment of a temperature dependent oscillator circuit.

FIG. 3 illustrates an example of an oscillator wave form where the capacitance charges up to VDD, discharges in accordance with the time constant –t/RC back to VDD/2, and then charges back up to VDD when the switch closes. In that way the oscillator 100 oscillates with a frequency that depends on the temperature dependent leakage current. As noted above, $V_c = V_{init} \times e^{-t/RC}$. To determine the time t, with $V_{init}=$VDD, then the capacitor voltage reaches VDD/2 when $V_c = VDD/2 = V_{DD} \times e^{-t/RC}$. Dividing both sides by VDD, results in $1/2 = e^{-t/RC}$. Taking the natural log of both sides yields $t = -RC\ln(1/2)$. Note that the result is shown to be independent of the supply voltage VDD. As described further herein, the value of the supply voltage may in fact influence the oscillator frequency and embodiments may correct for the supply voltage value.

Figure 4:
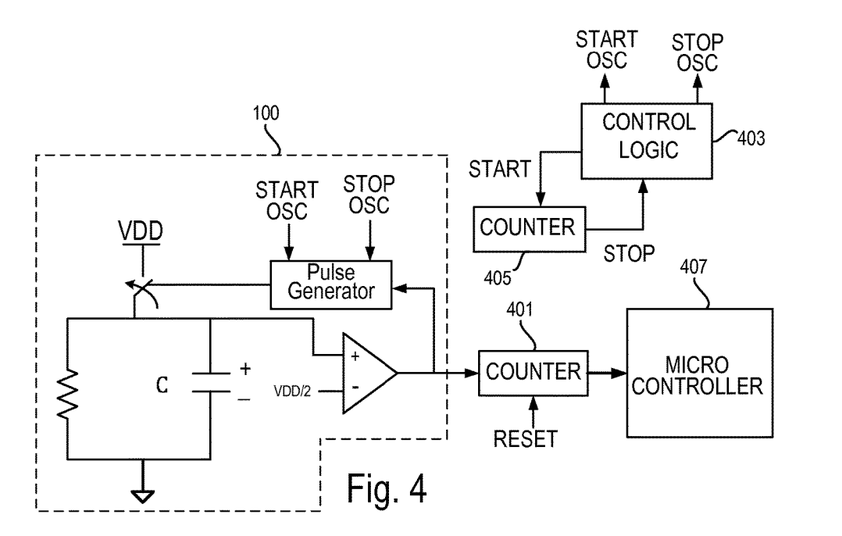
FIG. 4 illustrates additional details of how temperature information may be determined using the temperature dependent oscillation signal.
Figure 5:
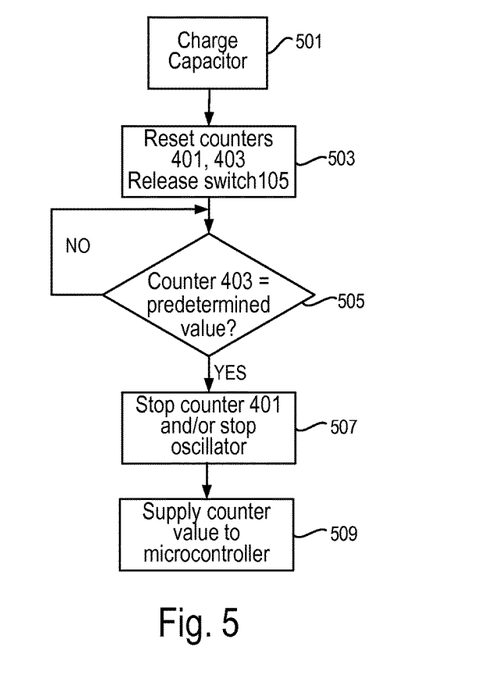
FIG. 5 illustrates a flow chart for control logic associated with the thermal oscillator.

FIG. 4 shows an embodiment that generates temperature information utilizing the output of the oscillator 100. As shown in FIG. 4, the output of the comparator 111 supplies a counter 401, which may be implemented as a ripple counter. The counter 401 counts the number of cycles of the oscillator 100. The control logic 403 determines how long the counter counts. In an embodiment the control logic 403 is implemented as a state machine. The control logic may operate in accordance with the flow chart shown in FIG. 5. At 501 the control logic causes the capacitor to initially charge (see 301 in FIG. 3) by, e.g., causing pulse generator 117 to close switch 109. At 503 the control logic causes counter 401 to reset and releases the switch 105 to allow the oscillator to begin oscillating and the counter 401 begins counting. Counter 405 is also reset to allow counting of the predetermined time period. Counter 405 is clocked with a known clock. The control logic checks in 505 to see counter 405 has counted to the predetermined value. When the control logic determines in 505 that the counter has reached the predetermined value, based on the known clock indicating, e.g., that 1 µs has elapsed, the counter 401 stops counting by disabling the counter and/or the oscillator may be stopped by, e.g., forcing switch 105 to remain open. Of course, the length of time that counter 401 counts oscillator cycles is system dependent and may be longer or shorter than the 1 µs example given above. Once counter 401 stops counting, the counter holds the number of oscillations that occurred over the predetermined time period. At that time, in 509 the counter value may be supplied to a microcontroller 407 to determine a temperature based on the counter value. The control logic may return to 501 and charge the capacitor when the next temperature measurement is desired.

Figure 6:
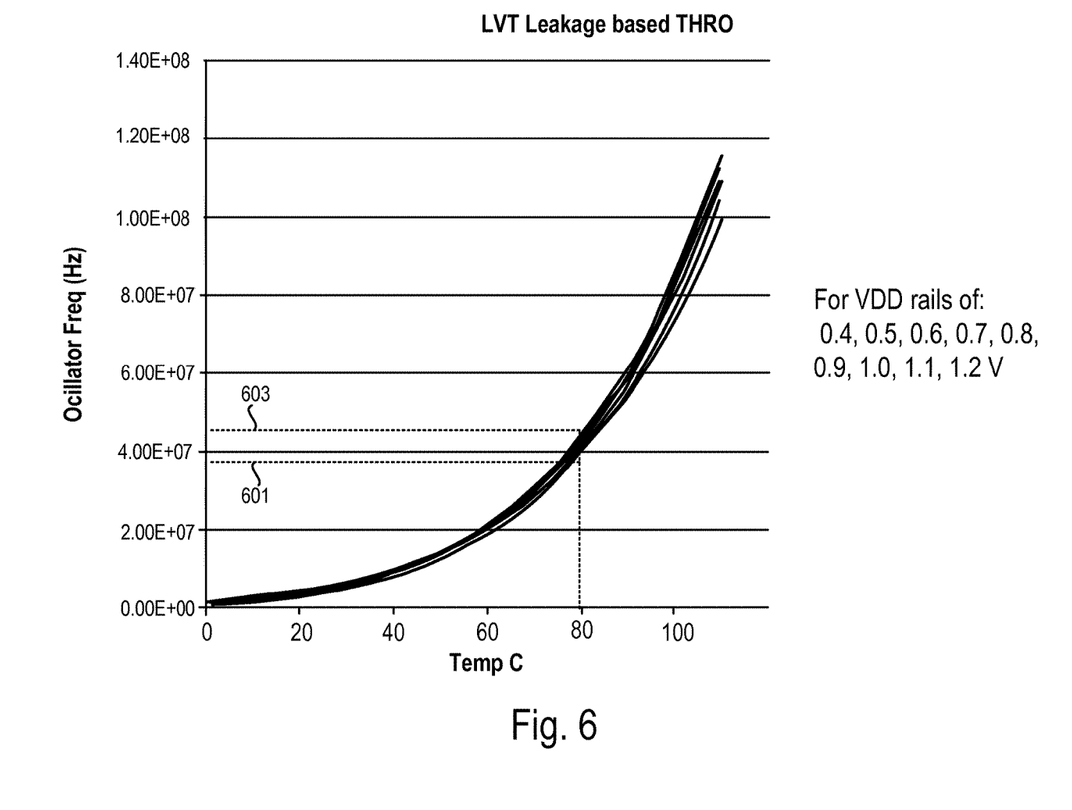
FIG. 6 shows a graph of oscillator frequency versus temperature for various values of the supply voltage VDD.

FIG. 6 shows simulation results of oscillator frequency versus temperature for various values of the supply voltage VDD (FIGS. 1, 2, and 4) ranging from 0.4 V to 1.2 V for an average process corner. For example, an oscillator frequency corresponding to 80° C. varies from less than 40 MHz at 601 to approximately 45 MHz at 603 for different supply voltages. As can be seen in FIG. 6, there is voltage dependent error.

Figure 7:
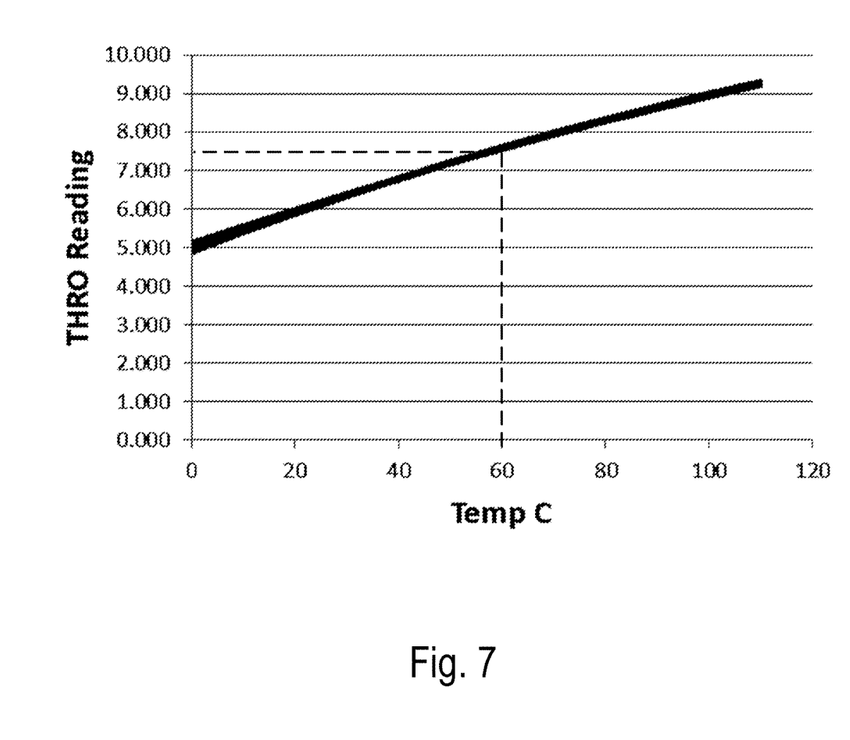
FIG. 7 illustrates linearized thermal values (THRO) based on natural log calculations of oscillator frequency results.

FIG. 7 illustrates a simulation of how a linearized thermal value may be determined by the microcontroller 407, using a natural log function that reduces error as a function of supply voltage. Note that while a microcontroller is illustrated in FIG. 4, any logic may be used to perform the appropriate natural log functions. The thermal reading of the oscillator (THRO) shown in FIG. 7 is calculated as THRO=ln(Count/Clock_Cycle_Cnt). Counter 401 supplies the Count value while the clock_cycle_cnt may be supplied from counter 405 or may be predetermined and correspond to, e.g., 1 µs. FIG. 7 shows various readings for different supply voltages (VDD in FIGS. 1, 2, and 4) ranging from 0.6 V to 1.2 V. For example, the temperature at a THRO reading of approximately 7.5 corresponds to approximately 60° C. for all of the different supply voltages. As can be seen from FIG. 7 the difference in temperature readings for the different supply voltages after applying the natural log function is small and the exponential temperature dependence dominates. FIG. 7 shows that using the natural log function linearizes the temperature reading and reduces error dependent on supply voltage.

Figure 8:
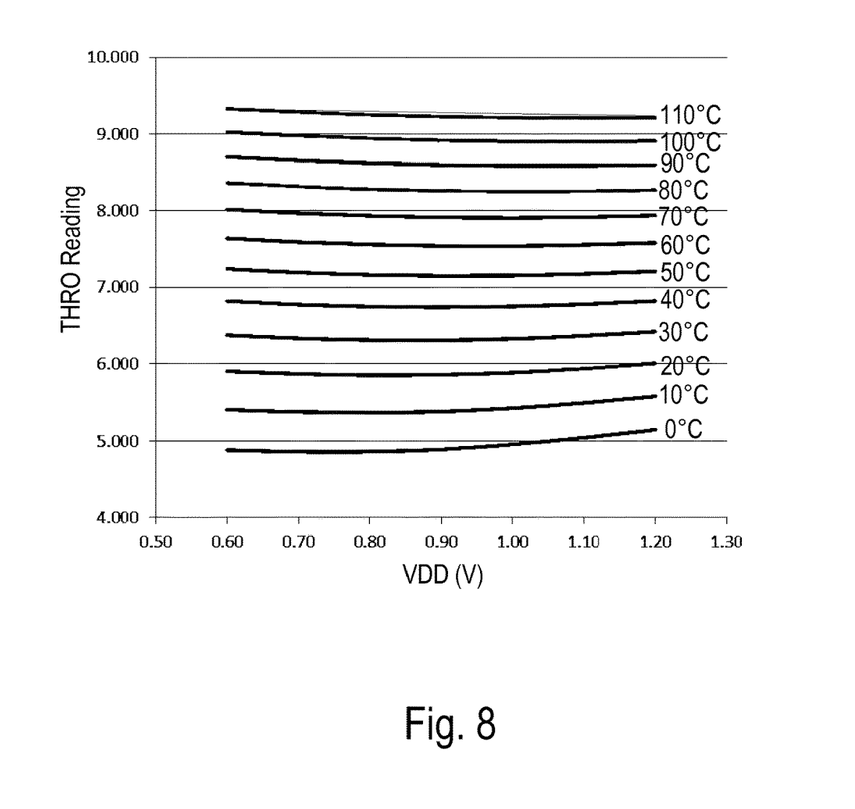
FIG. 8 illustrates a graph of THRO reading versus supply voltages for various temperatures from 0° C. to 110° C.

FIG. 8 illustrates a graph of simulation results of THRO reading versus supply voltages for various temperatures from 0° degrees C. to 110° degrees C. As can be seen the error in temperature reading caused by a different supply voltage is small but embodiments may need to calibrate out the voltage error. Thus, e.g., the THRO reading corresponding to 70° C. varies from a THRO reading of 8 at 0.6 V to a reading below 8 for other supply voltages. Note that the voltage dependence comes from 2nd order voltage dependence of the off transistor leakage current. After the natural log function has been applied, there is some residual voltage dependence.

In an embodiment a calibration procedure measures THRO at three temperatures: 20° C., 40° C., and 60° C. The temperature may be calibrated to an on-die thermal diode. The THRO readings are measured at three supply voltages: 0.6V, 0.9V, and 1.2V. While three voltages and three temperatures may be used in an embodiment, other embodiments may use two temperatures and/or two voltages, at the expense of less accurate calibration. Alternatively, more than three voltages and/or three temperatures may be used for increased calibration accuracy at the expense of additional test time.

Figure 9:
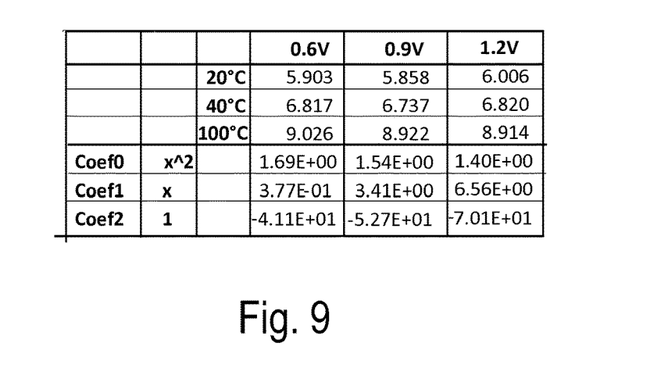
FIG. 9 illustrates a table showing the results of THRO determinations at three temperatures and three voltages that can be used for calibration and interpolation.

Temperature is a function of THRO that varies with VDD (T=F(THRO)@VDD)). In an embodiment second order polynomials generated based on three temperature measurements at three voltages. In an embodiment the polynomials are of the form $ax^2+bx+c$, where a, b, and c are the coefficients and x is the measured THRO value. FIG. 9 illustrates a table showing the results of THRO determinations at three temperatures and three voltages. THRO is shown for each of the temperatures. For example, at 20° C., THRO may be determined to be 5.903 for a 0.6V supply, 5.858 at 0.9V, and 6.006 at 1.2V. Similarly, the table shows the THRO results for 40° C., and 60° C. In addition, the table shows three coefficients (for the second order polynomial) for each of the voltages. The various coefficient values may be stored in non-volatile memory on the integrated circuit device after testing is complete.

During THRO sampling, the power supply voltage may be measured. Power supply monitors are known in the art and not further described herein. Based on the measured power supply the THRO is determined as THRO=Interpolate(F(THRO). Thus, interpolation may be used to determine a corrected THRO at the actual voltage supply value. For example, for a power supply measured at 0.75V, a temperature measurement interpolates between the polynomial determined for 0.6 V and the polynomial determined for 1.2V.

Figure 10:
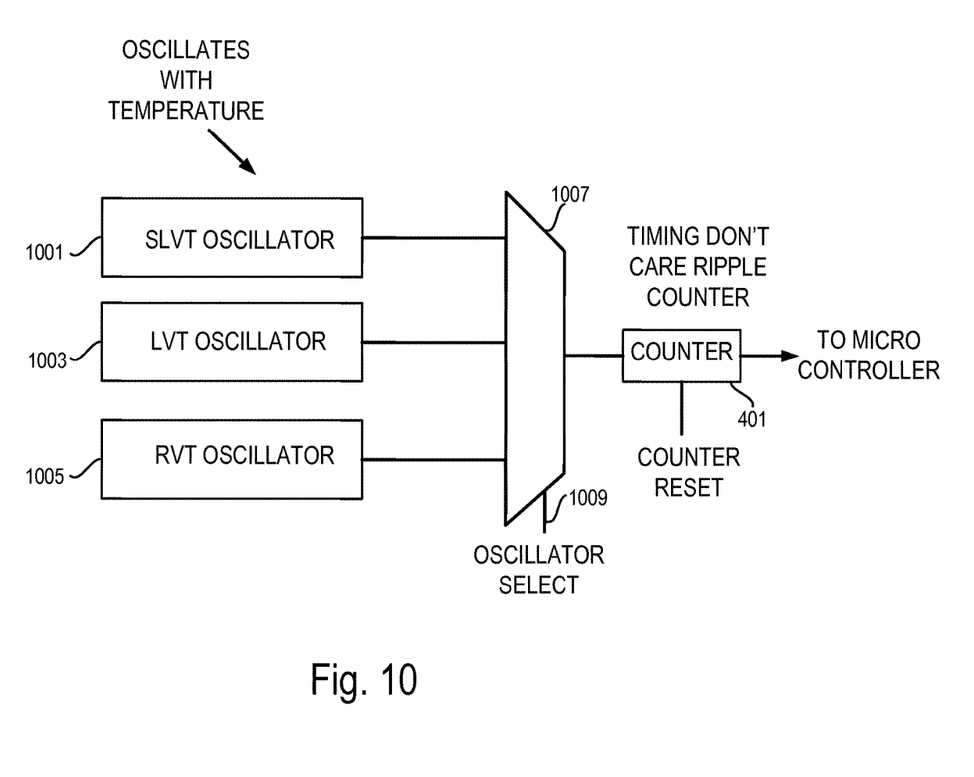
FIG. 10 illustrates an embodiment in which oscillators with transistors having different threshold voltages may be selected for use.

Because process may cause excursions in how the oscillator functions, FIG. 10 illustrates an embodiment where three oscillators are built, each oscillator having a MOS device 101 (see FIG. 1) that has a different threshold voltage. Thus, e.g., oscillator 1001 may have a MOS device with a super low threshold voltage (SLVT), oscillator 1003 may have MOS device with a low threshold voltage (LVT), and oscillator 1005 may have a MOS device with a regular threshold voltage (RVT). The oscillator outputs are supplied to a selector circuit 1007. The select signal 1009 may be based on the device characterization and thus devices characterized at different process corners may select oscillators with appropriate threshold voltages to match the process corner.

Figure 11:
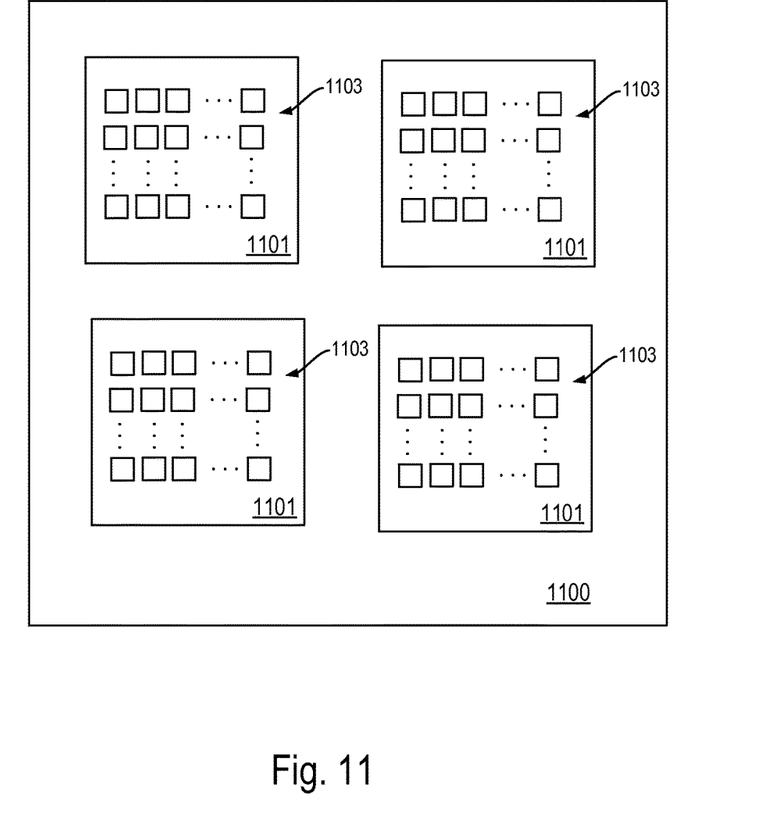
FIG. 11 illustrates an integrated circuit with multiple processing units with multiple thermal sensors.

FIG. 11 illustrates an embodiment of an integrated circuit 1100 that includes multiple processing units 1101. The processing units may include, e.g., one or more central processing units (CPUs) and/or one or more graphics processing unit (GPUs). The integrated circuit 1100 includes multiple temperature sensors 1103 such as shown in FIG. 4, including, e.g., the oscillator 100, counter 401 control logic 403, counter 405, and microcontroller 407. Where possible, some of these circuit elements, such as the microcontroller logic, may be shared among more than one temperature sensor. As described earlier, the finer granularity made possible by having more temperature sensors enabled by the small size of the temperature sensors 1103 compared to diode based temperature sensors, provides the ability to measure temperature of the various regions of the processing units 1101 more accurately. That in turn allows operation closer to thermal limits, which can result in increased CPU and/or GPU performance. Thus, a system including the CPUs and/or GPUs, memory, and an operating system, can provide better system performance by operating closer to thermal limits by maintaining higher performance levels in terms of, e.g., frequency and/or voltage, for the system overall or for specific portions of the system. For example, in a system with four processing cores, several cores may be able to operate at a higher performance level while other cores operate at lower performance levels because the accuracy of thermal sensing is improved with additional sensors. In addition, portions of a processing core may be able to operate at higher performance levels given the increased thermal measurement accuracy while other portions operate at lower performance levels.

While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiment set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

The invention claimed is:
1. A method comprising:
charging a capacitance from a voltage source through a switch;
discharging the capacitance through a transistor having a temperature dependent resistance;
comparing capacitance voltage to a predetermined threshold voltage and supplying an asserted compare signal responsive to the capacitance voltage being reduced to the predetermined threshold voltage through discharge of the capacitance through the transistor;
closing the switch to recharge the capacitance responsive to the asserted compare signal and then opening the switch to discharge the capacitance through the transistor;
repeating the charging and discharging with a frequency that is related to temperature of the transistor; and
generating a temperature value based on the frequency, the temperature value indicative of temperature of the transistor.
2. The method as recited in claim 1 further comprising counting cycles of the charging and discharging in a counter circuit for a predetermined time period and generating a count value corresponding to the frequency.

3. The method as recited in claim 2, further comprising: generating the temperature value based on the count value.

4. The method as recited in claim 3, further comprising: performing a natural log function as part of generating the temperature value.

5. The method as recited in claim 3, further comprising: correcting for a voltage value of the voltage source in determining the temperature value.

6. The method as recited in claim 1, further comprising maintaining a gate of the transistor at a voltage to keep the transistor in an off state during the discharging.

7. The method as recited in claim 5 further comprising storing calibration values associated with different temperatures and different voltages and using the calibration values to interpolate between measured voltage and measured temperature to correct for the voltage value.

8. The method as recited in claim 1 further comprising:
supplying a plurality of compare signals from a plurality of temperature dependent oscillators, each of the temperature dependent oscillators having a temperature dependent transistor with a different threshold voltage; and
selecting in a selector circuit one of the plurality of compare signals as the compare signal; and
supplying the compare signal to a counter to count charge and discharge cycles indicated by the compare signal.

9. The method as recited in claim 6 further comprising coupling the gate of the transistor to ground to keep the transistor in the off state during the discharge.

10. An apparatus comprising:
a temperature dependent oscillator including,
a transistor having a gate coupled to keep the transistor in an off state;
a capacitance coupled to discharge through the transistor having a discharge rate based on a leakage current through the transistor in the off state;
a voltage source coupled to charge the capacitance through a switch to a first voltage;
a comparator to compare a capacitance voltage of the capacitance to a predetermined threshold voltage that is lower than the first voltage and to assert a compare signal responsive to the capacitance voltage being at or lower than the predetermined threshold voltage;
a control signal based on the compare signal to close the switch to recharge the capacitance to the first voltage and then open the switch to allow the capacitance to again discharge through the transistor.

11. The apparatus as recited in claim 10 further comprising a counter circuit coupled to count cycles of the temperature dependent oscillator and supply a count value.

12. The apparatus as recited in claim 11, further comprising:
processing logic coupled to the counter circuit to process the count value and generate a determined value that corresponds to a temperature associated with the temperature dependent oscillator.

13. The apparatus as recited in claim 12, further comprising:
wherein the processing logic performs a natural log function as part of generating the determined value.

14. The apparatus as recited in claim 13, wherein the processing logic corrects for voltage of the voltage source in determining the determined value.

15. The apparatus as recited in claim 10, further comprising:
a second temperature dependent oscillator including,
a second transistor having a second gate coupled to keep the second transistor in an off state;
a second capacitance coupled to discharge through the second transistor with a discharge rate based on leakage current through the second transistor in the off state;
a second switch coupled to the voltage source to charge the second capacitance to the first voltage;
a second comparator to compare a voltage of the second capacitance to the predetermined threshold voltage lower and to assert a second compare signal responsive to the voltage of the second capacitance being at or lower than the predetermined threshold voltage;
a second control signal based on the second compare signal to close the second switch to recharge the capacitance and then open the second switch to allow the second capacitance to again discharge through the second transistor;
a selector circuit to select between a first output of the temperature dependent oscillator and a second output of the second temperature dependent oscillator and supply a selected output signal;
a counter circuit to count based on the selected output signal.

16. The apparatus as recited in claim 11 further comprising software operable to linearize a determined temperature value corresponding to temperature of the temperature dependent oscillator based on the count value and to correct for errors in the determined temperature value due to supply voltage of the temperature dependent oscillator.

17. The apparatus as recited in claim 10 wherein the leakage current is determined by temperature dependent resistance of the transistor in the off state.

18. The apparatus as recited in claim 11 wherein the counter circuit counts oscillations of the temperature dependent oscillator for a predetermined time period.

19. The apparatus as recited in claim 10 wherein the predetermined threshold voltage is half of the first voltage.

20. The apparatus as recited in claim 11 wherein the counter circuit is a ripple counter.

* * * * *